(12) United States Patent
Erickson et al.

(10) Patent No.: US 7,417,832 B1
(45) Date of Patent: Aug. 26, 2008

(54) MAGNETORESISTIVE STRUCTURE HAVING A NOVEL SPECULAR AND FILTER LAYER COMBINATION

(75) Inventors: Dustin W. Erickson, San Jose, CA (US); Chang-Man Park, Mountain View, CA (US); Shin Funada, Pleasanton, CA (US); Lena Miloslavsky, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 375 days.

(21) Appl. No.: 11/114,255

(22) Filed: Apr. 26, 2005

(51) Int. Cl.
*G11B 5/39* (2006.01)
(52) U.S. Cl. .................. 360/324.1; 360/324.2
(58) Field of Classification Search ............... 360/324, 360/324.1, 324.2, 324.11, 324.12
See application file for complete search history.

(56) References Cited

U.S. PATENT DOCUMENTS

| | | | |
|---|---|---|---|
| 5,874,010 A | 2/1999 | Tao et al. | |
| 5,898,612 A | 4/1999 | Chen et al. | |
| 6,407,890 B1 | 6/2002 | Gill | |
| 6,519,121 B1 | 2/2003 | Gill | |
| 6,556,390 B1 | 4/2003 | Mao et al. | |
| 6,591,481 B2 | 7/2003 | Shimazawa et al. | |
| 6,613,380 B1 | 9/2003 | Gill | |
| 6,636,398 B2 | 10/2003 | Sasaki et al. | |
| 6,693,776 B2 * | 2/2004 | Gill | 360/324.12 |
| 6,700,753 B2 | 3/2004 | Singleton et al. | |
| 6,735,060 B2 * | 5/2004 | Gill | 360/324.1 |
| 6,754,053 B2 | 6/2004 | Yoshikawa et al. | |
| 6,764,778 B2 | 7/2004 | Saito et al. | |
| 6,770,382 B1 | 8/2004 | Chang et al. | |
| 6,775,111 B2 | 8/2004 | Lin et al. | |
| 6,795,279 B2 | 9/2004 | Singleton et al. | |
| 6,853,520 B2 | 2/2005 | Fukuzawa et al. | |
| 7,006,337 B2 * | 2/2006 | Dieny et al. | 360/324 |
| 7,026,063 B2 | 4/2006 | Ueno et al. | |
| 7,038,890 B2 * | 5/2006 | Pinarbasi | 360/324.1 |
| 7,050,273 B2 * | 5/2006 | Horng et al. | 360/324.1 |
| 7,130,163 B2 | 10/2006 | Fukuzawa et al. | |
| 2002/0004147 A1 | 1/2002 | Ueno et al. | |
| 2002/0024778 A1 * | 2/2002 | Xue et al. | 360/324.1 |
| 2002/0048127 A1 | 4/2002 | Fukuzawa et al. | |
| 2002/0163765 A1 | 11/2002 | Gill | |

(Continued)

OTHER PUBLICATIONS

Office Action dated Jul. 11, 2007 from U.S. Appl. No. 11/114,295, 11 pages.

(Continued)

*Primary Examiner*—William J Klimowicz
(74) *Attorney, Agent, or Firm*—Strategic Patent Group

(57) ABSTRACT

A method and system for providing a magnetoresistive structure is disclosed. The magnetoresistive structure includes a pinned layer, a nonmagnetic spacer layer, a free layer, a filter layer, a specular layer, a barrier layer, and a capping layer. The nonmagnetic spacer layer resides between the pinned layer and the free layer. The free layer is electrically conductive and resides between the filter layer and the nonmagnetic spacer layer. The specular layer includes a first material and is electrically insulating. The barrier layer resides between the specular oxide layer and the capping layer. The barrier layer is nonmagnetic and includes a second material different material from the first material. The capping layer includes a third material different from the second material.

18 Claims, 6 Drawing Sheets

U.S. PATENT DOCUMENTS

| | | |
|---|---|---|
| 2002/0191354 A1 | 12/2002 | Yoshikawa et al. |
| 2002/0196589 A1 | 12/2002 | Gill |
| 2003/0026049 A1 | 2/2003 | Gill |
| 2004/0130833 A1* | 7/2004 | Zhang et al. ............ 360/324.11 |
| 2004/0136121 A1 | 7/2004 | Mao et al. |
| 2004/0170867 A1 | 9/2004 | Chang et al. |
| 2005/0024771 A1 | 2/2005 | Le |
| 2005/0047028 A1 | 3/2005 | Fukuzawa et al. |
| 2005/0066517 A1 | 3/2005 | Bedell et al. |
| 2005/0068665 A1 | 3/2005 | Le et al. |
| 2005/0094322 A1 | 5/2005 | Fukuzawa et al. |
| 2005/0099738 A1 | 5/2005 | Xue et al. |
| 2005/0111145 A1 | 5/2005 | Yuasa et al. |
| 2005/0231853 A1* | 10/2005 | Li et al. ................... 360/324.1 |
| 2005/0231854 A1* | 10/2005 | Kawai ..................... 360/324.1 |
| 2006/0028773 A1* | 2/2006 | Shimazawa et al. ...... 360/324.1 |
| 2006/0162148 A1* | 7/2006 | Horng et al. ............. 29/603.08 |
| 2006/0181815 A1* | 8/2006 | Horng et al. ........... 360/324.12 |

OTHER PUBLICATIONS

Jongill Hong, et al., "Design of specularly reflective layers in spin valves", Journal of Applied Physics, vol. 94, No. 5, Sep. 2003, pp. 3288-3291.

Jongill Hong, et al., "Spin Valve Head With Specularly Reflective Oxide Layers for Over 100 Gb/in2", IEEE Transactions on Magnetics, vol. 38, No. 1, Jan. 2002, pp. 15-19.

Tetsuya Mizuguchi, et al., "Characteristics of Spin-Valve Films with Non-Magnetic Oxide Layers for Specular-Scattering", IEEE Transactions on Magnetics, vol. 37, No. 4, Jul. 2001, pp. 1742-1744.

Hitoshi Kanai, et al., "Advanced Spin-Valve GMR Head", Fujitsu Sci. Tech. J., 37, 2, Dec. 2001, pp. 174-182.

Office Action dated Dec. 17, 2007 from U.S. Appl. No. 11/114,295, 18 pages.

* cited by examiner

US 7,417,832 B1

MAGNETORESISTIVE STRUCTURE HAVING A NOVEL SPECULAR AND FILTER LAYER COMBINATION

CROSS REFERENCE TO RELATED APPLICATIONS

This application is related to U.S. application Ser. No. 11/114,295, entitled METHOD AND SYSTEM FOR PROVIDING A SPIN FILTER HAVING ENHANCED RELIABILITY, filed concurrently herewith on Apr. 26, 2005, incorporated herein by reference

FIELD OF THE INVENTION

The present invention relates to magnetic recording technology, and more particularly to a method and system for providing an improved spin filter.

BACKGROUND OF THE INVENTION

In the effort toward achieving higher data density on recording media, spin filters have become of interest for use in magnetoresistive (MR) read heads. FIG. 1 is a diagram of a conventional spin filter 10. In general, the conventional spin filter 10 would be incorporated into a MR read head (not explicitly shown), which would include leads electrically connected to other electronics to drive current through the conventional spin filter 10 during reading. In such an application, current is generally driven in the current perpendicular to the plane (CPP) configuration. The CPP configuration is in the z-direction depicted in FIG. 1.

The conventional spin filter 10 includes a seed layer 20, an antiferromagnetic (AFM) layer 30, a pinned layer 40, a nonmagnetic spacer layer 50, a free layer 60, a filter layer 70, a specular oxide layer 80, and a capping layer 90. The seed layer 20 is used to provide the appropriate surface for growing the AFM layer 30 with the desired crystal structure. The AFM layer 30 is used in pinning the magnetization of the pinned layer 40. The pinned layer 40 may be a synthetic pinned layer, including ferromagnetic layers 42 and 46 separated by an electrically conductive spacer layer 44 that is typically Ru. The electrically conductive spacer layer 44 has a thickness configured to ensure that the ferromagnetic layers 42 and 46 are antiferromagnetically coupled. Thus, the magnetization of the ferromagnetic layer 42 is pinned by the AFM layer 30. The magnetization of the ferromagnetic layer 46 is set because it is strongly antiferromagnetically coupled to the magnetization of the ferromagnetic layer 42. The nonmagnetic spacer layer 50 is typically electrically conductive, for example Cu. The free layer 60 is ferromagnetic and typically includes materials such as CoFe. The filter layer 80 has a high electrical conductivity and typically includes materials such as Cu. The specular oxide layer 80 may be a nano-oxide and typically includes materials such as alumina. The combination of the filter layer 70 and the specular oxide layer 80 ensures adequate specularity of scattering of electrons from the free layer 60 that are incident on the specular oxide layer 80. Consequently, the magnetoresistance of the conventional spin filter 10 is adequate. The capping layer 90 is typically oxidized Ta.

Although the conventional spin filter 10 functions, there are drawbacks to the use of the conventional spin filter 10. Insertion of the specular oxide layer 80 can increase the coercivity of the free layer 60, which is undesirable. Furthermore, the specular oxide layer 80 is generally a nano-oxide that can continue to oxidize during processing. The signal may degrade during the lifetime of the conventional spin filter 10. The conventional spin filter 10 thus suffers thermal instabilities and may have reduced reliability.

Analogous conventional spin filters are described in U.S. Pat. No. 6,795,279 B2; U.S. Pat. No. 6,556,390 B1; U.S. Pat. No. 5,898,612; U.S. Pat. No. 6,407,690 B1; U.S. Pat. No. 6,764,778 B2; U.S. Pat. No. 6,700,753 B2; U.S. Pat. No. 6,775,111 B2; U.S. Pat. No. 6,591,481; U.S. Pat. No. 6,613,380 B1; U.S. Pat. No. 6,636,398 B2.

Accordingly, what is needed is a system and method for providing a spin filter having improved thermal stability, signal sensitivity, and/or reliability.

SUMMARY

A method and system for providing a magnetic structure is disclosed. The method and system comprise providing a pinned layer, a nonmagnetic spacer layer, a free layer, a filter layer, a specular layer, a barrier layer, and a capping layer. The nonmagnetic spacer layer resides between the pinned layer and the free layer. The free layer is electrically conductive and resides between the filter layer and the nonmagnetic spacer layer. The specular layer includes a first material and is electrically insulating. The barrier layer resides between the specular oxide layer and the capping layer. The barrier layer is nonmagnetic and includes a second material different material from the first material. The capping layer includes a third material different from the second material.

DETAILED DESCRIPTION OF THE PREFERRED EMBODIMENTS

Figure 1:
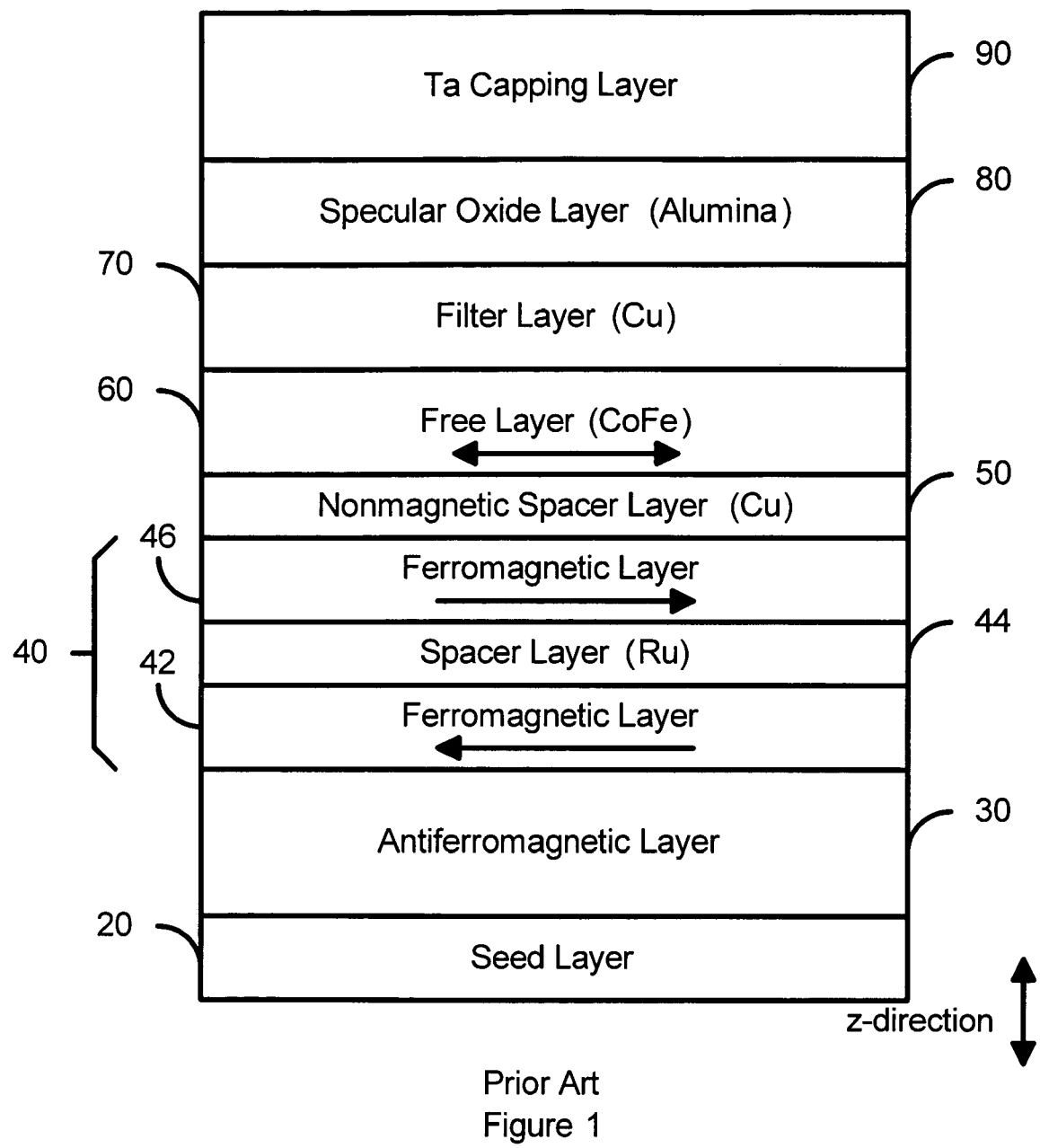
FIG. 1 is a diagram of a conventional spin filter.
Figure 2:
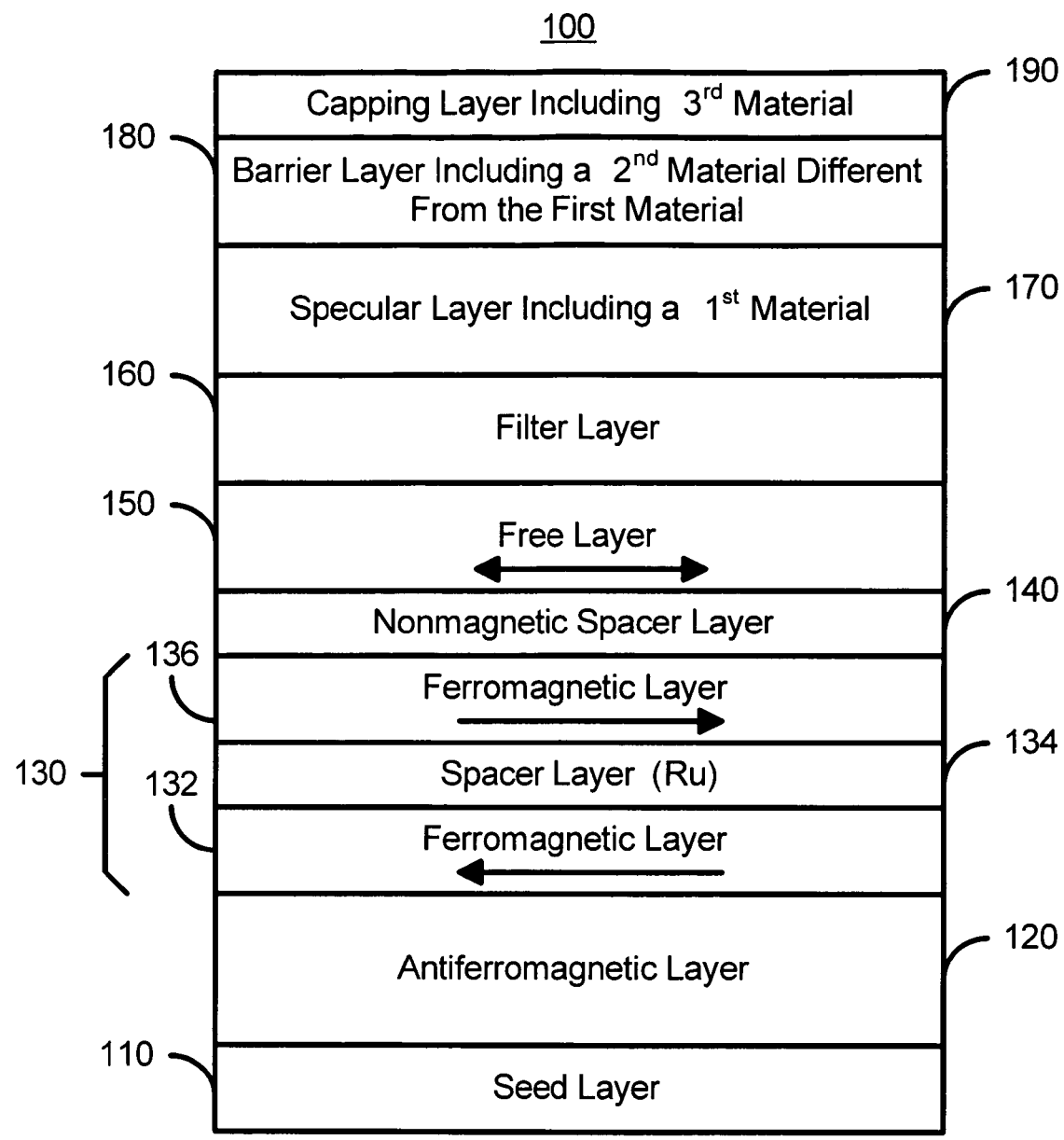
FIG. 2 is a diagram of a spin filter formed in accordance with an exemplary embodiment of the present invention.

FIG. 2 depicts a spin filter 100 formed in accordance with an exemplary embodiment of the present invention. For clarity, the spin filter 100 is not depicted to scale. The spin filter 100 includes a pinning layer 120, pinned layer 130, nonmagnetic spacer layer 140, a free layer 150, a filter layer 160, a specular layer 170, and a capping layer 180. The spin filter 100 may also include seed layer(s) 110 used to ensure that the pinning layer 120 has the desired crystal structure and, therefore, magnetic properties. For example, the seed layer(s) 110 might include Ta, Ta/NiFe, NiCr, NiFeCr or any combination thereof.

The pinning layer 120 is generally an AFM layer. The AFM materials used in the pinning layer 120 can include, but are not limited to PtMn, NiMn, PtCrMn, or IrMn. The pinned layer 130 is preferably a synthetic pinned layer including ferromagnetic layers 132 and 136 separated by a spacer layer 134. The spacer layer 134 is preferably Ru. The thickness of the spacer layer is selected such that the ferromagnetic layers 132 and 136 are antiferromagnetically coupled. However, another type of pinned layer 130, such as a simple pinned layer, may be used. In the embodiment shown, the magnetization of the ferromagnetic layer 132 is pinned by the pinning layer 120. The magnetization of the ferromagnetic layer 136 is set based on the coupling with the ferromagnetic layer 132 and, therefore, acts as a reference. The nonmagnetic spacer layer 140 is preferably an electrical conductor, such as Cu, an alloy of Cu, Ta, Pt, Au, Ag, Pd, Ru, or other low electrical resistance material(s). In another embodiment, the nonmagnetic spacer layer 140 may be an insulator. In such an embodiment, the nonmagnetic spacer layer 140 is preferably sufficiently thin to act as a tunneling barrier. The free layer 150, as well as the ferromagnetic layers 132 and 136 may include $Co_{1-x}Fe_x$ alloy, where x can vary from one to ninety-nine atomic percent. However, other suitable materials, a simple free layer, or a synthetic free layer for the free layer 150 may be used. The capping layer 190 is a capping layer, such as a Ta layer that has been formed into a natural oxide.

The spin filter 100 also includes the filter layer 160, a specular layer 170, a barrier layer 180, and a capping layer 190 in accordance with the present invention. The filter layer 160 has a low electrical resistance in comparison to the free layer 150. The filter layer 160 preferably includes at least one of Cu, Ta, Au, Ag, Pd, Ru, and Rh. The specular layer 170 is configured such that current carriers from the free layer 150 tend to undergo specular reflection by the specular oxide layer. The specular layer 170 is preferably a nano-oxide layer and is, therefore, insulating. The specular layer 170 has a thickness of between five and thirty Angstroms, and more preferably a thickness of between six and twenty Angstroms. The barrier layer 180 has a thickness of between five and thirty Angstroms, and more preferably a thickness of between six and twenty Angstroms.

The properties of the filter layer 160, the specular layer 170, the barrier layer 180, and, in some embodiments, the capping layer 190 are related. In a preferred embodiment, the filter layer 160 and the specular layer 170 are configured to preclude formation of a solid solution and intermixing between the filter layer 160 and the specular layer 170. The barrier layer 180 is configured to prevent the specular layer 170 from intermixing with other layers, such as the capping layer 190. Thus, the specular layer 170 includes a first material. The barrier layer 180 includes a second material different from the first material. The capping layer 190 includes a third material different from the second material.

The materials selected for the barrier layer 180, specular layer 170, and filter layer 160 are interrelated. In one embodiment, the barrier layer 180 includes at least one of Pt, Ag, Au, Pd, Ru, Rh, and Re. The specular layer 170 may include at least one of yttrium oxide, hafnium oxide, magnesium oxide, aluminum oxide, nickel oxide, iron oxide, zirconium oxide, and titanium oxide. In a preferred embodiment, the barrier layer 180 consists essentially of Pt alone. Also in that preferred embodiment, the specular layer 170 includes titanium oxide and the filter layer 160 includes at least one of copper, gold, and silver. However, other material(s) could be used for the specular layer 170 if the barrier layer 180 is essentially composed of Pt. For example, the specular layer 170 may include aluminum oxide, while the filter layer 160 includes gold. In another embodiment, if the specular layer 170 includes titanium oxide, other materials, such as Ag, Au, Pd, Ru, Rh, and Re may be used for the barrier layer 180. The filter layer 160 includes at least one of Cu, Ta, Au, Ag, Pd, Ru, and Rh.

The spin filter 100 having the combination of the spin filter layer 160, the specular layer 170, the barrier layer 180, and the capping layer 190 may have improved thermal stability and performance. Because of the combination of the filter layer 160 and the specular layer 170, the intermixing between the filter layer 160 and the specular layer 170 may be reduced. Due to the presence of the barrier layer 180, the intermixing between the specular layer 170 and the capping layer 190 may be reduced. In a preferred embodiment, for example in which the barrier layer 180 consists essentially of Pt, the specular layer 170 includes titanium oxide and the filter layer 160 includes at least one of copper, gold, and silver, the intermixing is reduced while the high signal may be preserved. Thus, the spin filter 100 may have the desired signal without the adversely affecting the electrical resistance or reliability. Consequently, both the performance and the reliability of the spin filter 100 may be improved. Moreover, it is noted that the spin filter 100 may be used in either a CPP or CIP (current in plane) configuration.

Figure 3:
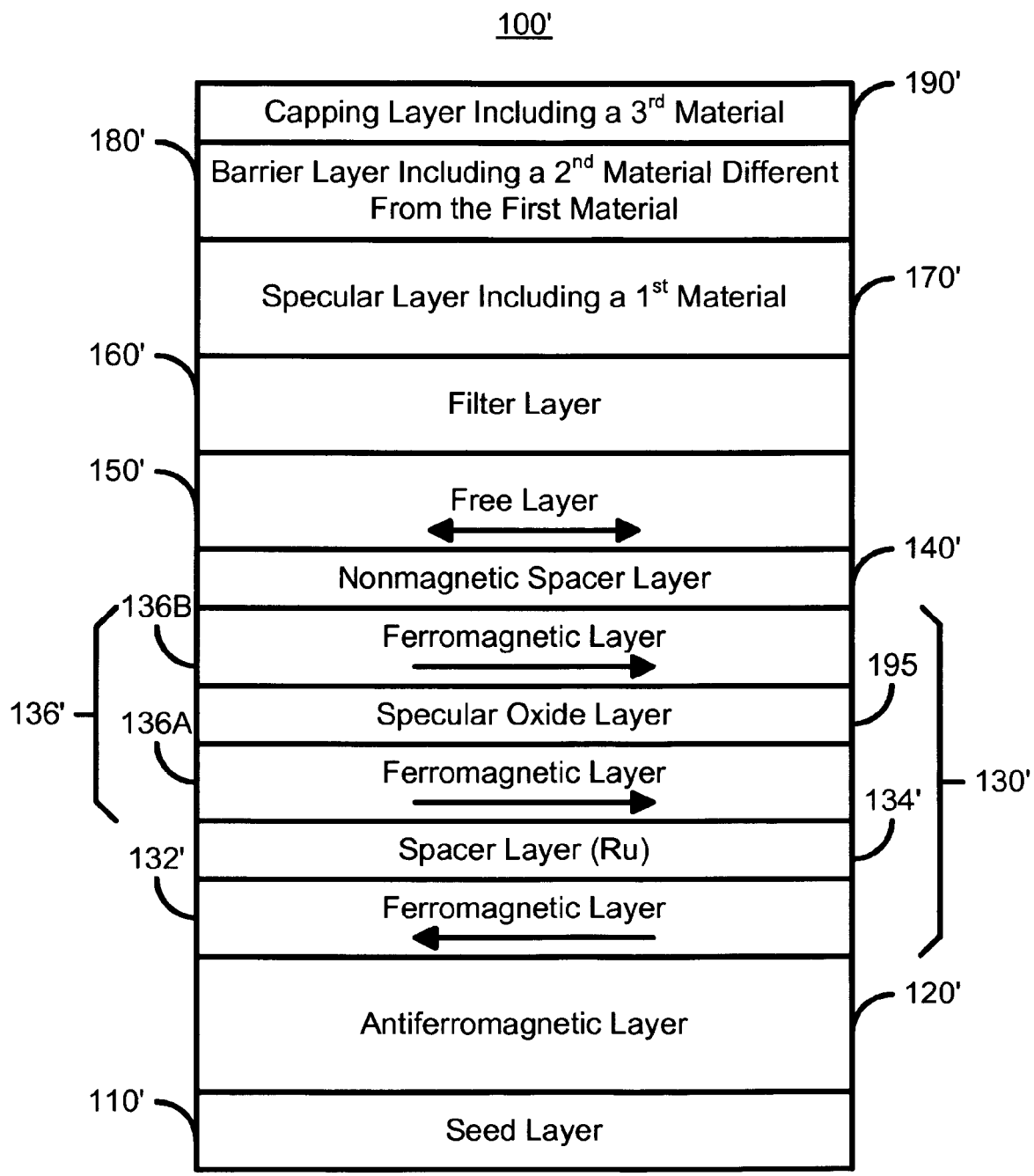
FIG. 3 is a diagram of a spin filter formed in accordance with another exemplary embodiment of the present invention.

FIG. 3 is a diagram of a spin filter 100' formed in accordance with another exemplary embodiment of the present invention. For clarity, the spin filter 100' is not depicted to scale. The spin filter 100' includes components analogous to the components of the spin filter 100. Consequently, the spin filter 100' includes a pinning layer 120', pinned layer 130', nonmagnetic spacer layer 140', a free layer 150', a filter layer 160', a specular layer 170', a barrier layer 180', and a capping layer 190'. The spin filter 100 may also include seed layer(s) 110'.

The layers 110', 120', 130', 140', 150', 160', 170', 180', and 190' preferably have the same structure and function as the layers 110, 120, 130, 140, 150, 160, 170, 180, and 190. For example, the filter layer 160' preferably includes at least one of Cu, Ta, Au, Ag, Pd, Ru, and Rh and has a high electrical conductivity. The specular layer 170' is configured such that current carriers from the free layer 150' tend to undergo specular reflection by the specular oxide layer. The specular layer 170' is preferably a nano-oxide layer and is, therefore, electrically insulating. The specular layer 170' has the same thickness ranges as the specular layer 170' of FIG. 2. In a preferred embodiment, the filter layer 160' and the specular layer 170' are configured to preclude formation of a solid solution and intermixing between the filter layer 160' and the specular layer 170'. The barrier layer 180' is configured to prevent the specular layer 170' from intermixing with the capping layer 170'. The specular layer 170' includes a first material. The barrier layer 180' includes a second material different from the first material. The capping layer 190' includes a third material different from the second material.

The materials selected for the barrier layer 180', specular layer 170', and filter layer 160' are interrelated. Preferably, the materials used for the barrier layer 180', the specular layer 170', and the filter layer 160' are the same as for the barrier layer 180, the specular layer 170, and the filter layer 160, respectively, depicted in FIG. 2. Referring back to FIG. 3, the barrier layer 180' includes at least one of Pt, Ag, Au, Pd, Ru, Rh, and Re, but preferably consists essentially of Pt. The specular layer 170' may include at least one of yttrium oxide, hafnium oxide, magnesium oxide, aluminum oxide, nickel oxide, iron oxide, zirconium oxide, and titanium oxide. The specular layer 170' preferably includes titanium oxide and the filter layer 160 includes at least one of copper, gold, and silver. However, other material(s) could be used for the specular layer 170' if the barrier layer 180' is essentially composed of Pt. For example, the specular layer 170' may include aluminum oxide, while the filter layer 160' includes gold if the barrier layer 180' is composed essentially of Pt. In another embodiment, if the specular layer 170' includes titanium oxide, other materials, such as Ag, Au, Pd, Ru, Rh, and Re may be used for the barrier layer 180'. The filter layer 160' includes at least one of Cu, Ta, Au, Ag, Pd, Ru, and Rh.

The spin filter 100' also includes an additional specular oxide layer 195, which resides within the ferromagnetic layer 136'. The specular oxide layer 195 is preferably a nano-oxide layer. Thus, the ferromagnetic layer 136' includes ferromagnetic layers 136A and 136B. The specular oxide layer 195 is configured such that current carriers from the free layer 150' tend to undergo specular reflection by the specular oxide layer 195.

The spin filter 100' shares many of the benefits of the spin filter 100. Thus, the spin filter 100' may have improved thermal stability and performance. For example, because of the combination of the filter layer 160', the specular layer 170', and the barrier layer 180', the thermal stability of the spin filter 100' may be improved. In a preferred embodiment, using the materials described above, the stability may be improved while the high signal may be preserved. Consequently, both the performance and the reliability of the spin filter 100' may be improved. Moreover, it is noted that the spin filter 100' may be used in either a CPP or CIP (current in plane) configuration.

Figure 4:
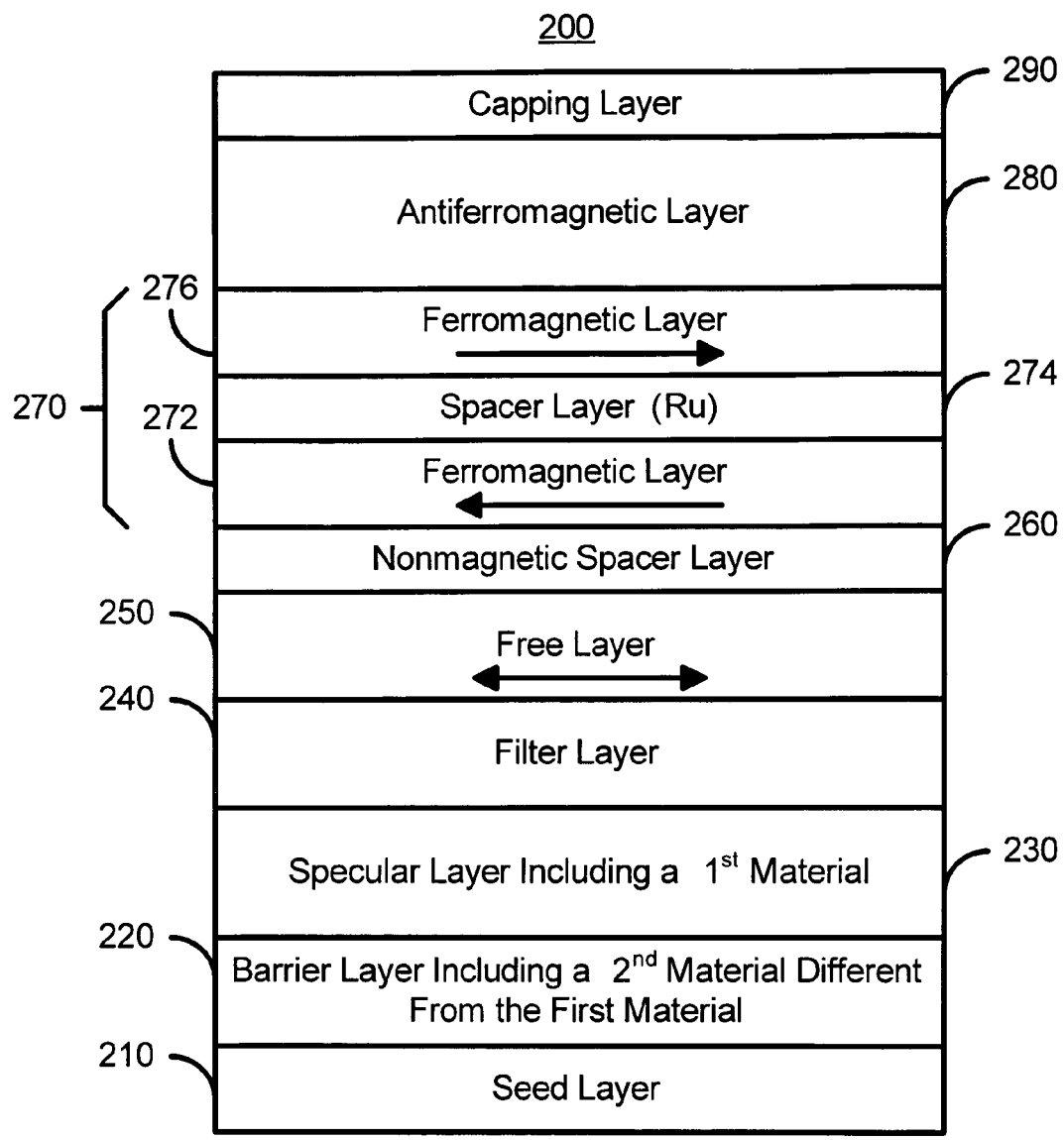
FIG. 4 is a diagram of a spin filter formed in accordance with another exemplary embodiment of the present invention.

FIG. 4 is a diagram of a spin filter 200 formed in accordance with another exemplary embodiment of the present invention. For clarity, the spin filter 200 is not depicted to scale. The spin filter 200 is analogous to the spin filter 100, but is a top spin filter. Consequently, the spin filter 200 has layers 210, 280, 270, 260, 250, 240, 230, 220, and 290 are analogous to layers 110, 120, 130, 140, 150, 160, 170, 180, and 190, respectively. The spin filter 200 includes a pinning layer 280, pinned layer 270, nonmagnetic spacer layer 260, a free layer 250, a filter layer 240, a specular layer 230, a barrier layer 220, and a capping layer 280. The spin filter 200 may also include seed layer(s) 210. The pinned layer 270 also preferably includes ferromagnetic layers 272 and 276 separated by nonmagnetic spacer layer 274.

The layers 210, 280, 270, 260, 250, 240, 230, 220, and 290 preferably have the same structure and function as the layers 110, 120, 130, 140, 150, 160, 170, 180, and 190, respectively, depicted in FIG. 2. Referring back to FIG. 4, for example, the barrier layer 220, the specular layer 230, and the filter layer 240 preferably have the same structure and function and include the same materials with the same thicknesses as the barrier layer 180, the specular layer 170, and the filter layer 160, respectively, depicted in FIG. 2.

Thus, the spin filter 200 shares many of the benefits of the spin filter 100 depicted in FIG. 2. Referring back to FIG. 4, the spin filter 200 having the combination of the spin filter layer 240, the specular layer 230, and the barrier layer 220 may have improved thermal stability and performance. Because of the combination of the filter layer 240 and the specular layer 230, the intermixing between the filter layer 240 and the specular layer 230 may be reduced. Due to the barrier layer 220, the intermixing between the specular layer 230 and underlying layers, such as the seed layer(s) 210, may be reduced. Thus, the spin filter 200 may have the desired signal without the adversely affecting the electrical resistance or reliability. Consequently, both the performance and the reliability of the spin filter 200 may be improved. Moreover, it is noted that the spin filter 200 may be used in either a CPP or CIP (current in plane) configuration.

Figure 5:
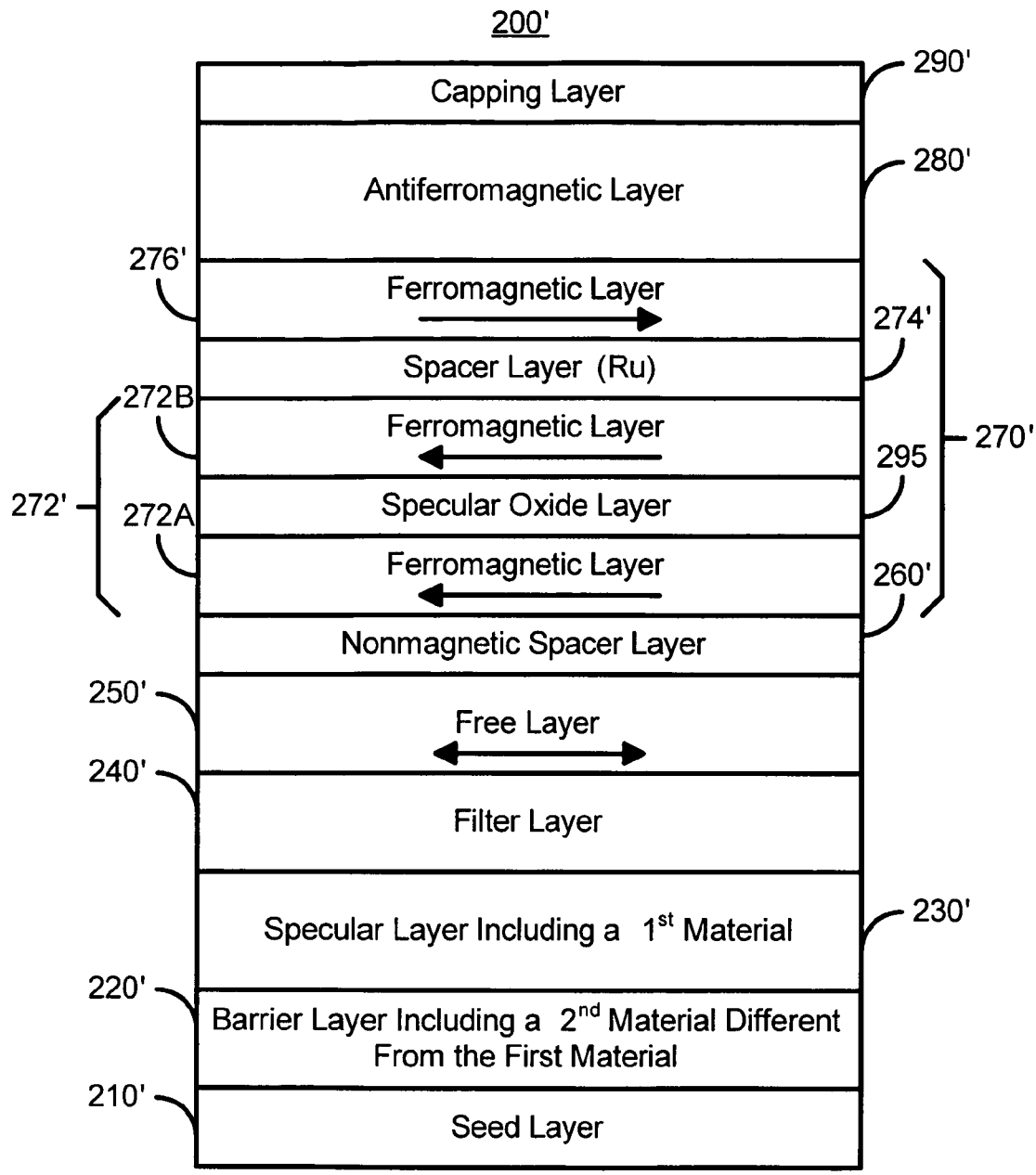
FIG. 5 is a diagram of a spin filter formed in accordance with another exemplary embodiment of the present invention.

FIG. 5 is a diagram of a spin filter 200' formed in accordance with another exemplary embodiment of the present invention. For clarity, the spin filter 200' is not depicted to scale. The spin filter 200' includes components analogous to the components of the spin filter 200. Consequently, the spin filter 200' includes a barrier layer 220', a specular layer 230', filter layer 240', a free layer 250', a nonmagnetic spacer layer 260', a pinned layer 270', a pinning layer 280', and a capping layer 290'. The spin filter 200' may also include seed layer(s) 210'.

The layers 210', 220', 230', 240', 250', 260', 270', 280', and 290' preferably have the same structure and function as the layers 210, 220, 230, 240, 250, 260, 270, 280, and 290. For example, the specular layer 230 is preferably a nano-oxide layer including a first material, while the barrier layer 220' includes a second material different from the first material. In a preferred embodiment, the barrier layer 220' consists essentially of Pt, the specular layer 230 includes titanium oxide, and the filter layer includes Ag, Au or Cu. However, other materials, such as those described above, may be used.

In addition, the spin filter 200' includes an additional specular oxide layer 295, which resides within the ferromagnetic layer 272'. Thus, the ferromagnetic layer 272' includes ferromagnetic layers 272A and 272B. The specular oxide layer 295 is preferably a nano-oxide layer. The specular layer 230 is configured such that current carriers from the free layer 250' tend to undergo specular reflection by the specular oxide layer 295.

The spin filter 200' shares many of the benefits of the spin filter 200. For example, because of the combination of the filter layer 240', the specular layer 230', and the barrier layer 220', the thermal stability of the spin filter 200' may be improved. Moreover, it is noted that the spin filter 200' may be used in either a CPP or CIP (current in plane) configuration.

Figure 6:
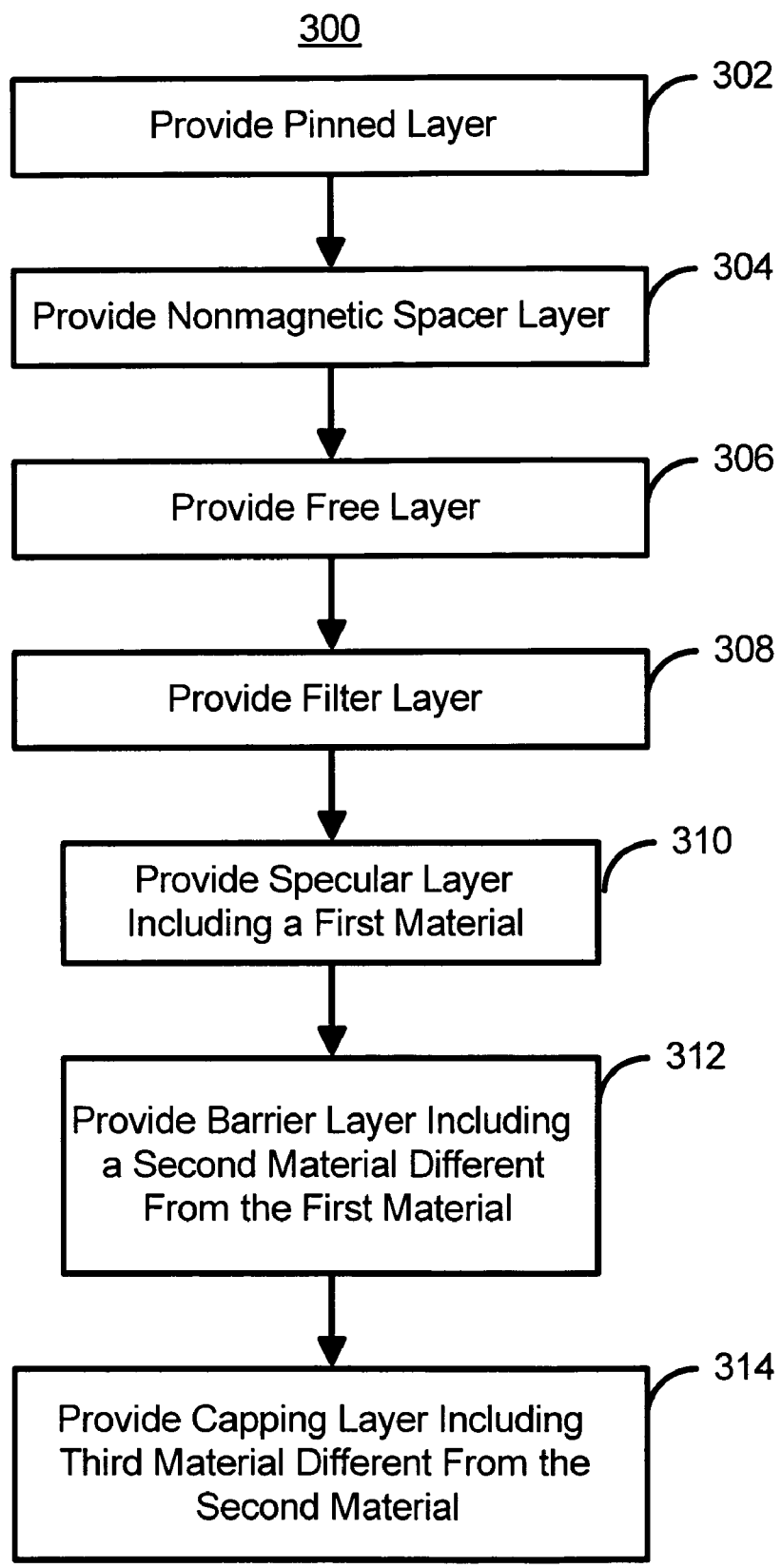
FIG. 6 is a high-level flow chart depicting a method for fabricating a spin filter in accordance with an exemplary embodiment of the present invention.

FIG. 6 is a high-level flow chart depicting a method 300 for fabricating a spin filter in accordance with an exemplary embodiment of the present invention. The method 300 is described in the context of the spin filter 100. However, the method 300 may be used for another spin filter consistent with the present invention. Moreover, the method 300 is described in the context of forming a single spin filter. One of ordinary skill in the art will readily recognize, however, that the method 300 may be used in simultaneously forming multiple spin filters.

The method 300 preferably commences after the pinning layer 120 has been provided. The pinned layer 130 is provided, via step 302. Step 302 preferably includes providing the ferromagnetic layers 132 and 136, as well as the spacer layer 134. The nonmagnetic spacer layer 140 is provided, via step 304. Step 304 preferably includes providing an electrically conductive layer, such as Cu. However, in an alternate embodiment, an insulator forming a tunneling barrier is provided in step 304. The free layer 150 is provided such that the nonmagnetic spacer layer 140 resides between the free layer 150 and the pinned layer 130, via step 306. The filter layer 160 is provided, via step 308. Step 308 fabricates the filter layer 160 such that the free layer 150 is between the filter layer 160 and the nonmagnetic spacer layer 140. The specular layer 170 that includes a first material is provided on the filter layer 160, via step 310. In a preferred embodiment, the specular layer 170 is provided in step 310 by depositing a metallic layer, then oxidizing the metal layer. In a preferred embodiment, a plasma oxidation process preferably from ten to three hundred seconds is used to oxidize the specular metals. However, other oxidation processes such as natural oxidation may have similar utility. The barrier layer 180 is provided, via step 312. The barrier layer 180 provided in step 312 includes a second material different from the first material. The capping layer 190 is provided, via step 314. The capping layer 190 includes a third material different from the second material. In a preferred embodiment, the capping layer 190 includes Ta.

Using the method 300, the spin filter 100, 100', 200, or 200' may be provided.

We claim:

1. A magnetoresistive structure comprising;
a pinned layer;
a nonmagnetic spacer layer;
a free layer, the nonmagnetic spacer layer residing between the pinned layer and the free layer;
a filter layer, the free layer residing between the filter layer and the nonmagnetic spacer layer, the filter layer being electrically conductive;
a specular layer, the specular layer including a first material and being an insulator;
a barrier layer, the barrier layer being nonmagnetic, the barrier layer including a second material different material from the first material, the barrier layer including at least one of Pt, Ag, Au, Ru, and Re; and
a capping layer including a third material different from the second material, the barrier layer residing between the specular layer and the capping layer.

2. The magnetoresistive structure of claim 1 wherein the specular layer includes titanium oxide.

3. The magnetoresistive structure of claim 1 wherein the specular layer has a thickness of between five and thirty Angstroms.

4. The magnetoresistive structure of claim 3 wherein the thickness of the specular layer is between six and twenty Angstroms.

5. The magnetoresistive structure of claim 1 wherein the barrier layer has a thickness of between five and thirty Angstroms.

6. The magnetoresistive structure of claim 5 wherein the thickness of the barrier layer is between six and fifteen Angstroms.

7. The magnetoresistive structure of claim 1 wherein the filter layer includes at least one of Cu, Ta, Au, Ag, Pd, Ru, and Rh.

8. The magnetoresistive structure of claim 1 wherein the barrier layer is configured to prevent intermixing between the specular layer and the capping layer.

9. The magnetoresistive structure of claim 1 wherein the capping layer includes Ta.

10. The magnetoresistive structure of claim 1 wherein the nonmagnetic spacer layer is electrically conductive.

11. The magnetoresistive structure of claim 1 wherein the nonmagnetic spacer layer is insulating.

12. The magnetoresistive structure of claim 1, wherein:
the specular layer comprises a first specular layer; and
the pinned layer comprises a second specular layer, the second specular layer comprising an oxide.

13. A magnetoresistive structure comprising;
a pinned layer;
a nonmagnetic spacer layer;
a free layer, the nonmagnetic spacer layer residing between the pinned layer and the free layer;
a filter layer, the free layer residing between the filter layer and the nonmagnetic spacer layer, the filter layer being electrically conductive;
a specular layer, the specular layer including a first material and being an insulator;
a barrier layer, the barrier layer being nonmagnetic, the barrier layer including a second material different material from the first material; and
a capping layer including a third material different from the second material, the barrier layer residing between the specular layer and the capping layer; and
wherein the barrier layer consists essentially of Pt.

14. The magnetoresistive structure of claim 13 wherein the specular layer comprises titanium oxide and the filter layer comprises at least one of copper, gold, and silver.

15. The magnetoresistive structure of claim 13 wherein the specular layer comprises aluminum oxide, and the filter layer comprises gold.

16. The magnetoresistive structure of claim 13 wherein the specular layer includes at least one of yittrium oxide, hafnium oxide, magnesium oxide, aluminum oxide, nickel oxide, iron oxide, zirconium oxide, and titanium oxide.

17. A magnetoresistive structure comprising;
a pinned layer;
a nonmagnetic spacer layer;
a free layer, the nonmagnetic spacer layer residing between the pinned layer and the free layer;
a filter layer, the free layer residing between the filter layer and the nonmagnetic spacer layer, the filter layer including at least one of Cu, Ta, Au, Ag, Pd, Ru, and Rh;
a specular layer, the specular layer including titanium oxide;
a barrier layer, the barrier layer including Pt; and
a Ta capping layer, the barrier layer residing between the specular layer and the Ta capping layer.

18. The magnetoresistive structure of claim 17, wherein:
the specular layer comprises a first specular layer; and
the pinned layer comprises a second specular layer, the second specular layer comprising an oxide.

* * * * *